United States Patent
Liu et al.

(10) Patent No.: US 12,062,711 B2
(45) Date of Patent: Aug. 13, 2024

(54) MANUFACTURING METHOD OF DISPLAY SUBSTRATE, DISPLAY SUBSTRATE AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Jun Liu, Beijing (CN); Luke Ding, Beijing (CN); Jingang Fang, Beijing (CN); Bin Zhou, Beijing (CN); Leilei Cheng, Beijing (CN); Wei Li, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 17/449,607

(22) Filed: Sep. 30, 2021

(65) Prior Publication Data
US 2022/0020867 A1    Jan. 20, 2022

Related U.S. Application Data

(63) Continuation of application No. 15/983,055, filed on May 17, 2018, now abandoned.

(30) Foreign Application Priority Data

Nov. 23, 2017   (CN) .......................... 201711181291.9

(51) Int. Cl.
*H01L 29/66*    (2006.01)
*H01L 21/027*   (2006.01)
(Continued)

(52) U.S. Cl.
CPC .... *H01L 29/66969* (2013.01); *H01L 21/0274* (2013.01); *H01L 21/31116* (2013.01);
(Continued)

(58) Field of Classification Search
CPC ......... H01L 29/78666; H01L 29/78675; H01L 29/66757; H01L 29/78648; H01L 21/0337;
(Continued)

(56) References Cited

U.S. PATENT DOCUMENTS 6,534,789 B2   3/2003   Ishida
6,556,265 B1   4/2003   Murade
(Continued)

FOREIGN PATENT DOCUMENTS

CN          1808255 A      7/2006
CN        104752436 A      7/2015
(Continued)

OTHER PUBLICATIONS

First Chinese Office Action dated Dec. 4, 2019, for corresponding Chinese Application No. 201711181291.9.

*Primary Examiner* — Latanya N Crawford Eason
(74) *Attorney, Agent, or Firm* — Kinney & Lange, P.A.

(57) ABSTRACT

A manufacturing method of a display substrate, a display substrate, and a display device. The manufacturing method includes: forming an active layer; forming a gate insulation film layer, a gate film layer and a photoresist film layer; exposing the photoresist film layer to a light and developing the exposed photoresist film layer until the developed photoresist film layer has a thickness of 1.8-2.2 μm and a slope angle not less than 70°; over-etching the gate film layer to form a gate electrode, an orthographic projection of the gate electrode being located within a region of an orthographic projection of the developed photoresist film layer; over-
(Continued)

etching the gate insulation film layer by a gaseous corrosion method to form a gate insulation layer; peeling off the photoresist film layer remaining on a surface of the gate electrode; and performing a conductive treatment to the active layer.

19 Claims, 3 Drawing Sheets

(51) Int. Cl.
  *H01L 21/311*     (2006.01)
  *H01L 21/3213*    (2006.01)
  *H01L 21/44*      (2006.01)
  *H01L 21/475*     (2006.01)
  *H01L 21/4757*    (2006.01)
  *H01L 21/4763*    (2006.01)
  *H01L 27/12*      (2006.01)
  *H01L 29/40*      (2006.01)
  *H01L 29/417*     (2006.01)
  *H01L 29/786*     (2006.01)

(52) U.S. Cl.
  CPC .. *H01L 21/31144* (2013.01); *H01L 21/32139* (2013.01); *H01L 21/44* (2013.01); *H01L 21/475* (2013.01); *H01L 21/47573* (2013.01); *H01L 21/47635* (2013.01); *H01L 27/1288* (2013.01); *H01L 29/401* (2013.01); *H01L 29/7869* (2013.01); *H01L 29/41733* (2013.01); *H01L 29/78633* (2013.01)

(58) Field of Classification Search
  CPC . H01L 21/0334; H01L 21/0274; H01L 21/47; H01L 21/475; H01L 21/4757; H01L 21/47573; H01L 21/47635; H01L 29/40; H01L 29/401; H01L 21/44; H01L 29/41733; H01L 29/66969; H01L 29/7869; H01L 21/31116; H01L 21/0331; H01L 27/1288

See application file for complete search history.

(56) References Cited

U.S. PATENT DOCUMENTS

| | | | |
|---|---|---|---|
| 6,661,476 | B1 | 12/2003 | Abe et al. |
| 7,306,980 | B2 | 12/2007 | Takehashi et al. |
| 8,420,546 | B2 | 4/2013 | Uehara et al. |
| 9,660,090 | B2 | 5/2017 | Yoon |
| 9,954,043 | B2 | 4/2018 | Park et al. |
| 10,304,860 | B2 | 5/2019 | Zhang et al. |
| 10,475,868 | B2 | 11/2019 | Park et al. |
| 2001/0019127 | A1 | 9/2001 | Ishida |
| 2004/0229415 | A1* | 11/2004 | Takehashi ......... H01L 29/78621 |
| | | | 257/E21.414 |
| 2007/0155182 | A1 | 7/2007 | Uehara et al. |
| 2008/0283840 | A1 | 11/2008 | Dio et al. |
| 2013/0037870 | A1 | 2/2013 | Furukawa |
| 2015/0187959 | A1 | 7/2015 | Yoon |
| 2015/0279670 | A1* | 10/2015 | Cho .................... H01L 29/7869 |
| | | | 257/43 |
| 2015/0370110 | A1 | 12/2015 | Lin et al. |
| 2016/0357044 | A1* | 12/2016 | Lv ....................... G02F 1/13439 |
| 2017/0110527 | A1* | 4/2017 | Li ........................ H01L 27/1248 |
| 2017/0194404 | A1 | 7/2017 | Park et al. |
| 2018/0040632 | A1 | 2/2018 | Zhang et al. |
| 2018/0204896 | A1 | 7/2018 | Park et al. |
| 2019/0067398 | A1 | 2/2019 | Liu |
| 2020/0035834 | A1* | 1/2020 | Chen ................ H01L 27/14603 |

FOREIGN PATENT DOCUMENTS

| | | |
|---|---|---|
| CN | 105470267 A | 4/2016 |
| CN | 106935628 A | 7/2017 |

* cited by examiner

MANUFACTURING METHOD OF DISPLAY SUBSTRATE, DISPLAY SUBSTRATE AND DISPLAY DEVICE

CROSS-REFERENCE TO RELATED APPLICATION(S)

This application is a continuation of U.S. application Ser. No. 15/983,055 filed on May 17, 2018, which in turn claims the priority benefit of Chinese Patent Application No. 201711181291.9 filed on Nov. 23, 2017 in the State Intellectual Property Office of China, the disclosures of which are incorporated herein by reference in their entireties.

BACKGROUND

Technical Field

Embodiments of the present disclosure relate to the field of display technology, and in particular, to a manufacturing method of a display substrate, a display substrate, and a display device.

Description of the Related Art

An Organic Light-Emitting Diode (OLED) display device has advantages such as thinness, lightness, wide viewing angle, active light emission, continuously adjustable light color, low cost, fast response speed, low energy consumption, low driving voltage, wide operating temperature range, simple production process, high luminous efficiency, flexible display and the like, therefore it is considered as a next-generation display technology with promising development.

SUMMARY

Embodiments of the present disclosure provide a manufacturing method of a display substrate, a display substrate and a display device to at least partially improve threshold voltage characteristic of a TFT and improve product quality of the display device.

An embodiment of the present disclosure provides a manufacturing method of a display substrate, comprising manufacturing a top-gate type thin film transistor on a side of a base substrate, wherein the manufacturing the top-gate type thin film transistor on the side of the base substrate comprises following steps:
forming an active layer;
forming a gate insulation film layer, a gate film layer and a photoresist film layer sequentially on a side of the active layer away from the base substrate;
exposing the photoresist film layer to a light using a mask as a protection mask, and developing the exposed photoresist film layer until the developed photoresist film layer has a thickness of 1.8-2.2 μm and a slope angle that is not less than 70°;
over-etching the gate film layer to form a gate electrode using the developed photoresist film layer as a protection mask, an orthographic projection of the gate electrode on the base substrate being located within a region of an orthographic projection of the developed photoresist film layer on the base substrate;
over-etching the gate insulation film layer by a gaseous corrosion method to form a gate insulation layer using the developed photoresist film layer as a protection mask;
peeling off the photoresist film layer remaining on a surface of the gate electrode; and
performing a conductive treatment to the active layer using the gate insulation layer as a protection mask.

In an embodiment, the exposing the photoresist film layer to the light comprises: without exposing a region of the photoresist film layer corresponding to the gate electrode to be formed, fully exposing a region corresponding to an etched region of the gate film layer to the light.

In an embodiment, the gate insulation film layer is over-etched for an over-etching time of (20%~30%)*t by the gaseous corrosion method, where t is a normal time period during which the gate insulation film layer is etched to a predetermined depth.

In an embodiment, a gas atmosphere of the gaseous corrosion comprises carbon tetrafluoride ($CF_4$) at a flow rate of 2000 to 2500 SCCM and oxygen ($O_2$) at a flow rate of 200 to 650 SCCM.

In an embodiment, an edge of the orthographic projection of the gate electrode on the base substrate is spaced apart from an edge of the orthographic projection of the developed photoresist film layer on the base substrate by 1 to 1.5 μm.

In an embodiment, before the step of forming the active layer, the manufacturing method further comprises:
forming a light shielding layer on the base substrate, the active layer being opposite to the light shielding layer; and
forming a first insulation layer covering the light shielding layer on a side of the light shielding layer away from the base substrate.

In an embodiment, the manufacturing method further comprises:
forming a second insulation layer on a side of the gate electrode away from the base substrate.

In an embodiment, the manufacturing method further comprises:
forming a first via hole and a second via hole communicated to the active layer which has been performed by the conductive treatment, orthographic projections of the first via hole and the second via hole on the base substrate being respectively located at two sides of the orthographic projection of the gate electrode on the base substrate.

In an embodiment, the manufacturing method further comprises:
forming a source electrode and a drain electrode on a side of the second insulation layer away from the base substrate, the source electrode and the drain electrode being connected to the active layer which has been performed by the conductive treatment respectively through the first via hole and the second via hole.

In an embodiment, the manufacturing method further comprises:
forming a third via hole communicated to the first insulation layer, an orthographic projection of the third via hole on the base substrate being spaced apart from an orthographic projection of the active layer on the base substrate.

In an embodiment, the manufacturing method further comprises:
forming a fourth via hole communicated to the light shielding layer, an orthographic projection of the fourth via hole on the base substrate coinciding with the orthographic projection of the third via hole on the base substrate, and the light shielding layer being connected to the source electrode or the drain electrode through the fourth via hole and the third via hole.

In an embodiment, the fourth via hole, the first via hole and the second via hole are formed by one patterning process.

In an embodiment, after forming the source electrode and the drain electrode on the side of the second insulation layer away from the base substrate, the manufacturing method further comprises:

forming a passivation layer on a side of the source electrode and the drain electrode away from the base substrate.

In an embodiment, the manufacturing method further comprises:

forming a second insulation layer on a side of the gate electrode away from the base substrate;

forming a first via hole and a second via hole communicated to the active layer which has been performed by the conductive treatment, orthographic projections of the first via hole and the second via hole on the base substrate being respectively located at two sides of the orthographic projection of the gate electrode on the base substrate; and forming a source electrode and a drain electrode on a side of the second insulation layer away from the base substrate, the source electrode and the drain electrode being connected to the active layer which has been performed by the conductive treatment respectively through the first via hole and the second via hole.

In an embodiment, the manufacturing method further comprises:

forming a third via hole communicated to the first insulation layer, an orthographic projection of the third via hole on the base substrate being spaced apart from an orthographic projection of the active layer on the base substrate; and forming a fourth via hole communicated to the light shielding layer, an orthographic projection of the fourth via hole on the base substrate coinciding with the orthographic projection of the third via hole on the base substrate.

In an embodiment, after forming the source electrode and the drain electrode on the side of the second insulation layer away from the base substrate, the manufacturing method further comprises:

forming a passivation layer on a side of the source electrode and the drain electrode away from the base substrate.

An embodiment of the present disclosure further provides a display substrate manufactured by the manufacturing method of the display substrate according to any one of the foregoing embodiments.

An embodiment of the present disclosure further provides a display device, comprising the display substrate according to any one of the foregoing embodiments.

DETAILED DESCRIPTION OF PREFERRED EMBODIMENTS

In order to make objectives, technical solutions, and advantages of the present disclosure clearer, embodiments of the present disclosure will be described in detail below.

A Thin Film Transistor (TFT) on a display substrate of an OLED display device may be classified into two types, i.e., top-gate type and bottom-gate type. The top-gate type TFT includes: a light shielding layer, a first insulation layer, an active layer, a gate insulation layer, a gate electrode, a second insulation layer, and a source and drain layer, which are sequentially disposed on a base substrate, and a source electrode is arranged opposite to a drain electrode in the source and drain layer. In a manufacturing process of a display substrate, after forming the gate electrode on the base substrate, the gate insulation layer needs to be partially etched so that the active layer under the gate insulation layer can be partially exposed, then the exposed portion of the active layer is subjected to a conductive treatment, and finally the source electrode and the drain electrode are connected to the treated active layer through via holes.

In the manufacturing process of the display substrate, it is difficult to form an ideal morphology of the gate insulation layer if it does not meet etching process requirements. For example, in case that an edge of a surface of the gate insulation layer close to the gate electrode in the TFT completely coincides with an edge of the gate electrode, after the active layer is subjected to a conductive treatment, a length of a channel region which is located under the gate insulation layer and is not subjected to the conductive treatment will become short, resulting in deterioration of the threshold voltage characteristic of the TFT and thereby affecting the product quality of the display device.

In order to improve the threshold voltage characteristic of the TFT and improve the product quality of the display device, embodiments of the present disclosure provide a manufacturing method of a display substrate, a display substrate, and a display device.

Figure 1:
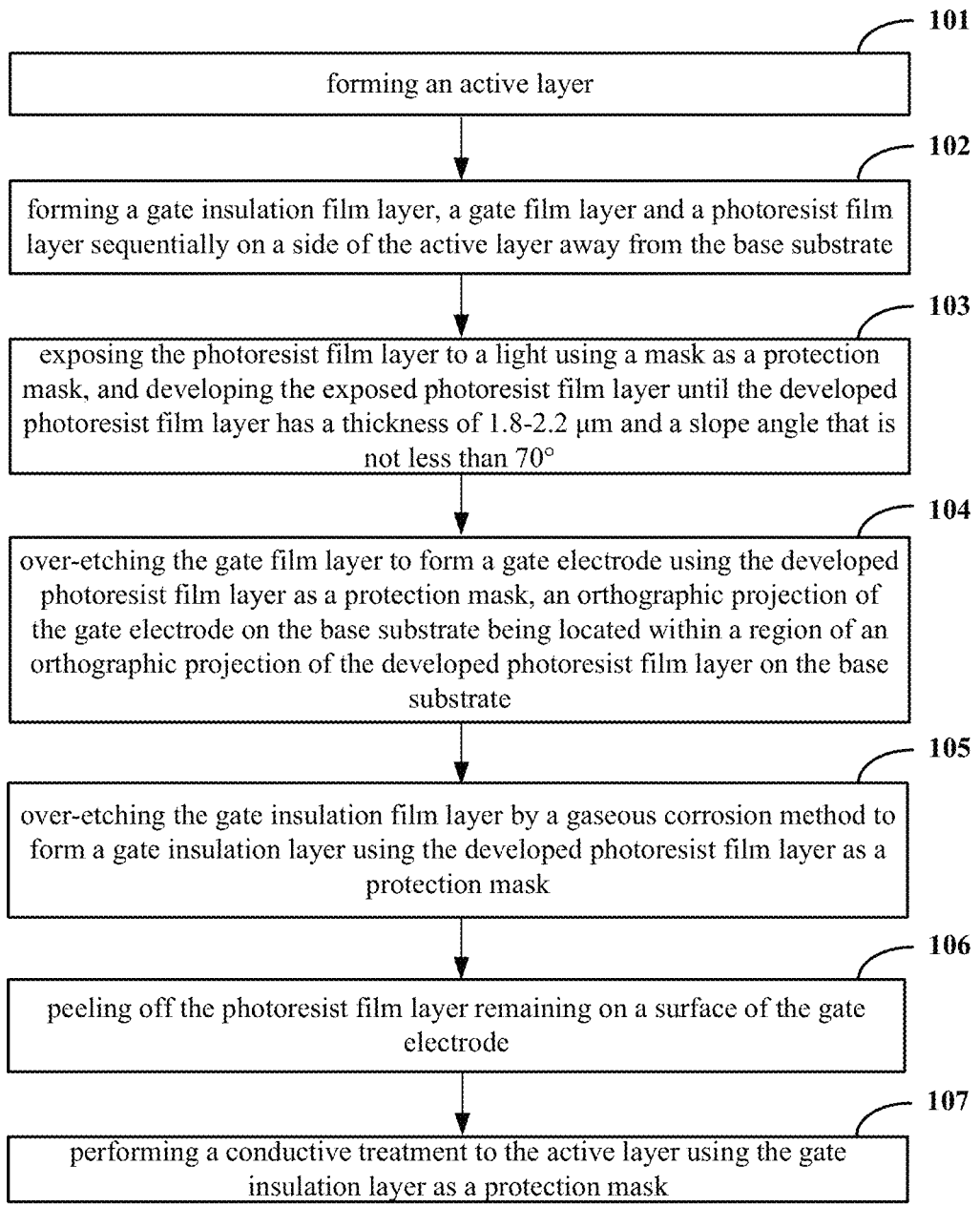
FIG. 1 is a flow chart of a manufacturing method of a display substrate according to an embodiment of the present disclosure.
Figure 2:
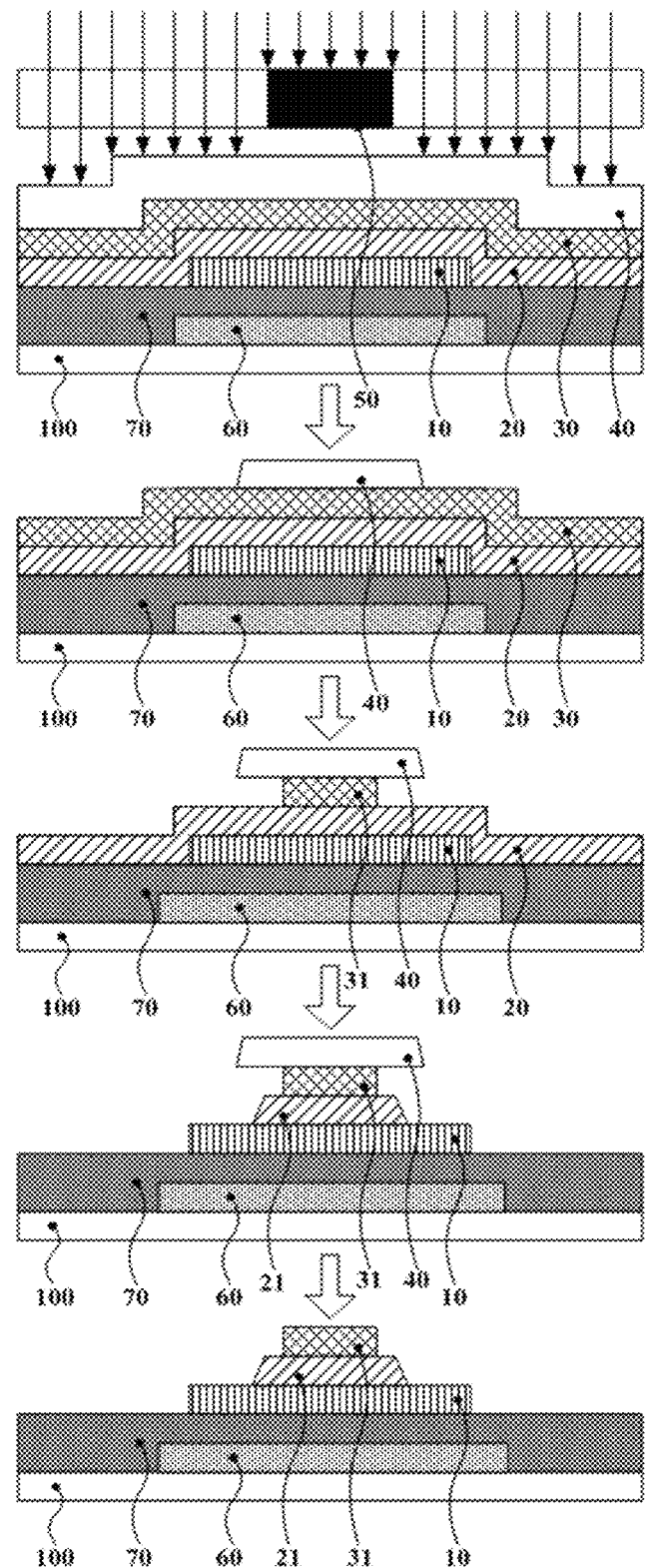
FIG. 2 is a schematic view showing a manufacturing process of a display substrate according to an embodiment of the present disclosure.

As shown in FIG. 1 and FIG. 2, a manufacturing method of a display substrate according to an embodiment of the present disclosure includes manufacturing a top-gate type thin film transistor on a side of a base substrate 100, wherein the manufacturing the top-gate type thin film transistor on the side of the base substrate 100 comprises following steps:

forming an active layer 10;

forming a gate insulation film layer 20, a gate film layer 30 and a photoresist film layer 40 sequentially on a side of the active layer 10 away from the base substrate 100;

exposing the photoresist film layer 40 to a light using a mask 50 as a protection mask, so that a region of the photoresist film layer 40 corresponding to the gate electrode to be formed is not exposed, and a region corresponding to an etched region of the gate film layer 30 is fully exposed; the region of the photoresist film layer 40 corresponding to the gate electrode to be formed refers to a region directly above the gate electrode to be formed in the photoresist film layer 40, and the region of the photoresist film layer 40 corresponding to the etched region of the gate film layer 30 refers to a region directly above the etched region of the gate film layer 30 in the photoresist film layer 40;

developing the exposed photoresist film layer 40 until the developed photoresist film layer 40 has a thickness of 1.8-2.2 µm and a slope angle that is not less than 70°; the slope angle of the photoresist film layer may be defined as an included angle between a side surface and a bottom surface of the photoresist film layer;

over-etching (OE) the gate film layer 30 to form a gate electrode 31 using the developed photoresist film layer 40 as a protection mask, an orthographic projection of the gate electrode 31 on the base substrate 100 being located within a region of an orthographic projection of the developed photoresist film layer 40 on the base substrate 100; Over-etching may refer to an etching process in which the etching time is greater than a normal etching time, where the normal etching time refers to a time period that it takes for a film with a thickness of h to be etched to an etching depth of h;

over-etching the gate insulation film layer 20 for an over-etching time of (20%~30%)*t by a gaseous corrosion method to form a gate insulation layer 21 using the developed photoresist film layer 40 as a protection mask; a gas atmosphere of the gaseous corrosion comprises carbon tetrafluoride ($CF_4$) at a flow rate of 2000 to 2500 SCCM and oxygen ($O_2$) at a flow rate of 200 to 650 SCCM; where t is a normal time period during which the gate insulation film layer 20 is etched to a predetermined depth;

peeling off the photoresist film layer 40 remaining on a surface of the gate electrode; and performing a conductive treatment to the active layer 10 using the gate insulation layer 21 as a protection mask.

Herein, SCCM is a unit of volumetric flow, which means milliliter per minute under a standard condition. The carbon tetrafluoride ($CF_4$) at the flow rate of 2000 to 2500 SCCM represents carbon tetrafluoride at a flow rate of 2000 to 2500 ml/min under the standard condition. The oxygen ($O_2$) at the flow rate of 200 to 650 SCCM represents oxygen at a flow rate of 200 to 650 ml/min under the standard condition. The specific material of the active layer 10 is not limited, and it may be selected from indium tin oxide (ITO) or IGZO with a thickness of 0.05 to 0.09 μm. The specific material of the gate insulation layer 21 is not limited, and it may be selected from a silicon oxide material with a thickness of 0.1 to 0.2 μm. The specific material of the gate electrode 31 is not limited, and it may be selected from copper or aluminum and other metal materials with a thickness of 0.4 to 0.6 μm. It should be noted that the gate film layer 30 may be etched by a wet etching method. When the gate film layer 30 is made from a copper material, the etching solvent may be hydrogen peroxide; when the gate film layer 30 is made from an aluminum material, the etching solvent may be mixed acid.

It should be noted that, before exposing the photoresist film layer 40 to the light, a pre-bake process is required. After the photoresist film layer 40 is exposed, a post-bake process is omitted and a development process is directly performed. In this way, it facilitates obtaining the photoresist film layer 40 with the above ideal thickness and slope angle. The purpose of over-etching the gate film layer 30 and the gate insulation film layer 20 is to prevent etching residue. When the thickness of the gate insulation film layer 20 is h, the normal time period during which the gate insulation film layer 20 is etched is a time period during which the etching depth reaches h.

A thin film transistor is formed on the base substrate 100 by using the manufacturing method provided by the embodiment of the present disclosure. By forming a photoresist film layer with a desired thickness and slope angle and by controlling the etching amount, a good morphology of the gate insulation layer 21 can be obtained without etching residue, thus the length of the channel region which is located under the gate insulation layer 21 will not be adversely affected when the active layer 10 is subsequently subjected to the conductive treatment, thereby improving the threshold voltage characteristic of the TFT and improving the product quality of the display device.

Optionally, an edge of the orthographic projection of the gate electrode 31 on the base substrate 100 is spaced apart from an edge of the orthographic projection of the developed photoresist film layer 40 on the base substrate 100 by 1 to 1.5 μm.

The designer of the present application has undergone a lot of experiments. According to the above manufacturing method, the orthographic projection of the gate insulation layer 21 on the base substrate 100 can be located within a region of the orthographic projection of the developed photoresist film layer 40 on the base substrate 100, and the edge of the side of the gate insulation layer 21 close to the gate electrode 31 exceeds the edge of the gate electrode 31, so that a good morphology of gate insulation layer 21 can be obtained and the length of the channel region which is located under the gate insulation layer 21 will not be adversely affected, thereby improving the threshold voltage characteristic of the TFT.

In an embodiment of the present disclosure, before the step of forming the active layer 10, the manufacturing method further comprises:

forming a light shielding layer 60 on the base substrate, the active layer 10 being opposite to the light shielding layer 60; and forming a first insulation layer 70 covering the light shielding layer 60 on a side of the light shielding layer 60 away from the base substrate 100.

The specific material of the light shielding layer 60 is not limited, and it may be selected from a metal material such as molybdenum or molybdenum-niobium alloy, with a thickness of 0.15 μm. The specific material of the first insulation layer 70 is not limited, and it may be selected from a silicon oxide material with a thickness of 0.3 to 0.5 μm.

Figure 3:
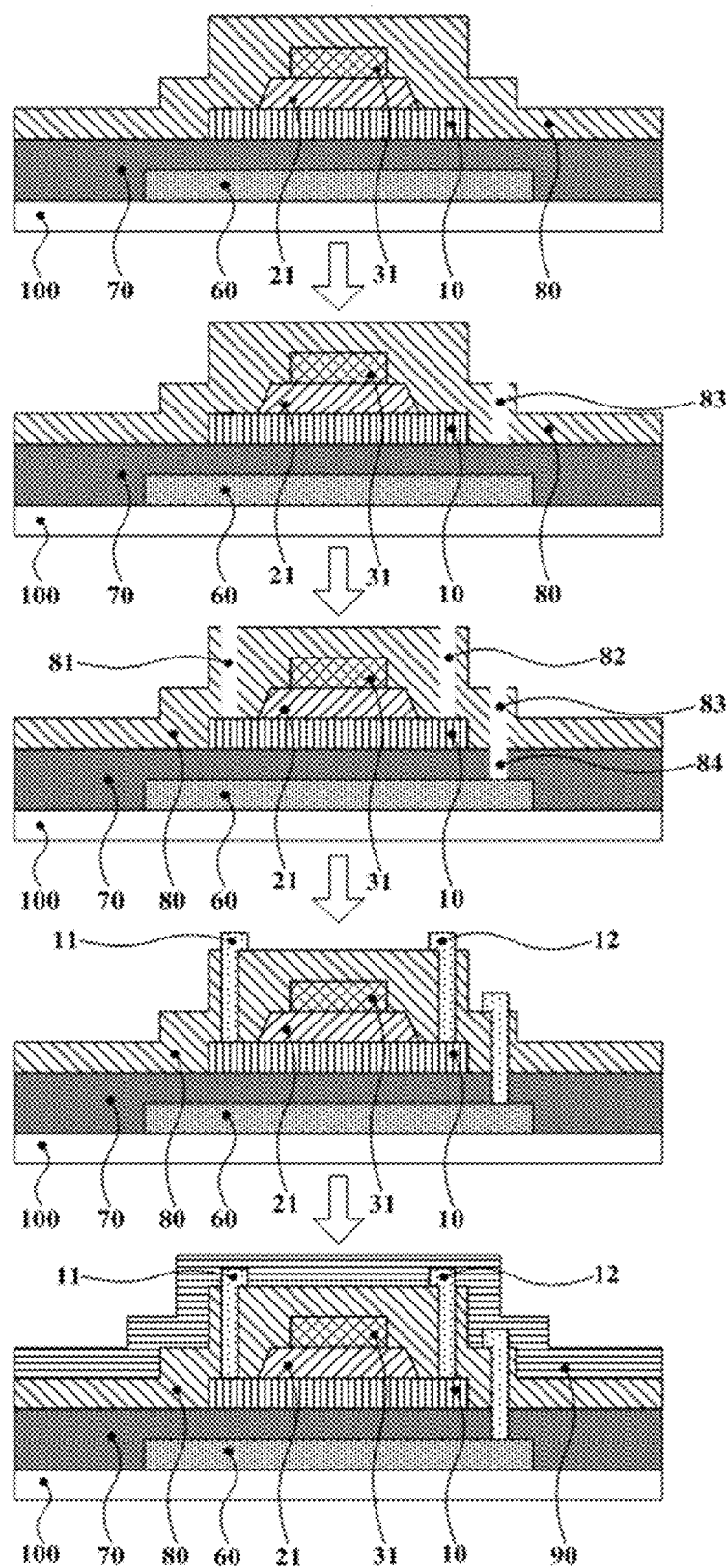
FIG. 3 is another schematic view showing a manufacturing process of a display substrate according to an embodiment of the present disclosure.

As shown in FIG. 3, in an embodiment of the present disclosure, the manufacturing method of the display substrate further comprises:

forming a second insulation layer 80 on a side of the gate electrode 31 away from the base substrate 100;

forming a first via hole 81 and a second via hole 82 communicated to the active layer 10 which has been performed by the conductive treatment, orthographic projections of the first via hole 81 and the second via hole 82 on the base substrate 100 are respectively located at two sides of an orthographic projection of the gate electrode 31 on the base substrate 100;

forming a source electrode 11 and a drain electrode 12 on a side of the second insulation layer 80 away from the base substrate 100, the source electrode 11 and the drain electrode 12 being connected to the active layer 10 which has been performed by the conductive treatment respectively through the first via hole 81 and the second via hole 82.

The specific material of the second insulation layer 80 is not limited, and it may be selected from a silicon oxide material with a thickness of 0.3 to 0.5 μm. The specific materials of the source electrode 11 and the drain electrode 12 are not limited, and they may be selected from copper or aluminum and other metal materials with a thickness of 0.5 to 0.7 μm.

Further referring to FIG. 3, in an embodiment of the present disclosure, the manufacturing method of the display substrate further comprises:

forming a third via hole 83 communicated to the first insulation layer 70, an orthographic projection of the third via hole 83 on the base substrate 100 is spaced apart from an orthographic projection of the active layer 10 on the base substrate 100;

forming a fourth via hole 84 communicated to the light shielding layer 60, an orthographic projection of the fourth via hole 84 on the base substrate 100 coinciding with the orthographic projection of the third via hole 83 on the base substrate 100, and the light shielding layer 60 being connected to the source electrode 11 or the drain electrode 12 through the fourth via hole 84 and the third via hole 83.

The light shielding layer 60 is generally made of metal, thus in the solution according to this embodiment, by connecting the light shielding layer 60 with the source electrode 11 or the drain electrode 12, cross-over resistance between the layers is reduced, thereby improving the performance of the TFT.

In an embodiment, the fourth via hole 84, the first via hole 81 and the second via hole 82 are formed by one patterning process. That is to say, after the second insulation layer 80 is formed on the side of the gate electrode 31 away from the base substrate 100, the third via hole 83 communicated to the first insulation layer 70 is formed by one patterning process, and then the fourth via hole 84, the first via hole 81 and the second via hole 82 are simultaneously formed by one patterning process, which can greatly simplify the manufacturing process of the display substrate.

In an embodiment, after forming the source electrode 11 and the drain electrode 12 on the side of the second insulation layer 80 away from the base substrate 100, the manufacturing method further comprises:

forming a passivation layer 90 on a side of the source electrode 11 and the drain electrode 12 away from the base substrate 100.

The specific material of the passivation layer 90 is not limited, and it may be selected from silicon oxide, a combination of silicon oxide and silicon nitride, with a thickness of 0.3 to 0.4 μm.

An embodiment of the present disclosure also provides a display substrate manufactured by the manufacturing method of the display substrate according to any one of the foregoing technical solutions. The threshold voltage characteristic of the TFT of the display substrate is improved.

An embodiment of the present disclosure also provides a display device comprising the display substrate according to any one of the foregoing technical solutions. Since the threshold voltage characteristic of the TFT of the display substrate is improved, the display device also has better product quality. The specific product type of the display device is not limited, and it may be, for example, a display, a display screen, a flat panel TV, or the like.

It will be apparent to those skilled in the art that various modifications and variations can be made to the embodiments of the present disclosure without departing from the spirit and scope of the present disclosure. Thus, if these modifications and variations to the present disclosure fall within the scope of the claims of the present disclosure and equivalent thereof, the present disclosure is also intended to include these modifications and variations.

What is claimed is:

1. A manufacturing method of a display substrate, comprising manufacturing a top-gate type thin film transistor on a side of a base substrate, wherein the manufacturing the top-gate type thin film transistor on the side of the base substrate comprises following steps:

forming an active layer, a gate insulation film layer, a gate film layer and a photoresist film layer sequentially on the base substrate;

pre-baking the photoresist film layer;

exposing the photoresist film layer to a light using a mask as a protection mask, and developing the exposed photoresist film layer without post-baking;

over-etching the gate film layer to form a gate electrode using the developed photoresist film layer as a protection mask;

over-etching the gate insulation film layer by a gaseous corrosion method to form a gate insulation layer using the developed photoresist film layer as a protection mask, wherein a gas atmosphere of the gaseous corrosion comprises carbon tetrafluoride ($CF_4$) at a flow rate of 2000 to 2500 SCCM and oxygen ($O_2$) at a flow rate of 200 to 650 SCCM;

peeling off the photoresist film layer remaining on a surface of the gate electrode; and performing a conductive treatment to the active layer using the gate insulation layer as a protection mask, wherein the gate film layer is made from a copper material, the gate film layer is etched by a wet etching method, and the etching solvent is hydrogen peroxide; and wherein the exposed photoresist film layer is developed until the developed photoresist film layer has a thickness of 1.8 μm to 2.2 μm and a slope angle not less than 70°.

2. The manufacturing method according to claim 1, wherein the gate insulation film layer is over-etched for an over-etching time of (20%~30%)*t by the gaseous corrosion method, where t is a normal time period during which the gate insulation film layer is etched.

3. The manufacturing method according to claim 1, wherein exposing the photoresist film layer to a light is performed so that a region of the photoresist film layer corresponding to the gate electrode to be formed is not exposed, and a region of the photoresist film layer corresponding to an etched region of the gate film layer is fully exposed.

4. The manufacturing method according to claim 1, wherein over-etching the gate film layer to form a gate electrode using the developed photoresist film layer as a protection mask is performed so that an orthographic projection of the gate electrode on the base substrate is located within a region of an orthographic projection of the developed photoresist film layer on the base substrate.

5. The manufacturing method according to claim 1, wherein an edge of an orthographic projection of the gate electrode on the base substrate is spaced apart from an edge of an orthographic projection of the developed photoresist film layer on the base substrate by 1 μm to 1.5 μm.

6. The manufacturing method according to claim 1, wherein before the step of forming the active layer, the manufacturing method further comprises:

forming a light shielding layer on the base substrate, the active layer being opposite in position to the light shielding layer; and forming a first insulation layer covering the light shielding layer on a side of the light shielding layer away from the base substrate.

7. The manufacturing method according to claim 6, wherein the light shielding layer has a thickness of 0.15 μm, and the first insulation layer has a thickness of 0.3 μm to 0.5 μm.

8. The manufacturing method according to claim 6, further comprising:
    forming a second insulation layer on a side of the gate electrode away from the base substrate;
    forming a first via hole and a second via hole communicated to the active layer which has been performed by the conductive treatment, orthographic projections of the first via hole and the second via hole on the base substrate being respectively located at first and second sides of the orthographic projection of the gate electrode on the base substrate; and
    forming a source electrode and a drain electrode on a side of the second insulation layer away from the base substrate, the source electrode and the drain electrode being connected to the active layer, which has been performed by the conductive treatment, respectively through the first via hole and the second via hole.

9. The manufacturing method according to claim 8, wherein the second insulation layer has a thickness of 0.3 µm to 0.5 µm, and the source electrode and the drain electrode each have a thickness of 0.5 µm to 0.7 µm.

10. The manufacturing method according to claim 8, further comprising:
    forming a third via hole communicated to the first insulation layer, an orthographic projection of the third via hole on the base substrate being spaced apart from an orthographic projection of the active layer on the base substrate; and
    forming a fourth via hole communicated to the light shielding layer, an orthographic projection of the fourth via hole on the base substrate coinciding with the orthographic projection of the third via hole on the base substrate, and the light shielding layer being connected to the source electrode or the drain electrode through the fourth via hole and the third via hole.

11. The manufacturing method according to claim 10, wherein the fourth via hole, the first via hole and the second via hole are formed by one patterning process and the third via hole are formed by another one patterning process.

12. The manufacturing method according to claim 8, wherein after forming the source electrode and the drain electrode on the side of the second insulation layer away from the base substrate, the manufacturing method further comprises:
    forming a passivation layer on a side of the source electrode and the drain electrode away from the base substrate.

13. The manufacturing method according to claim 12, wherein the passivation layer has a thickness of 0.3 µm to 0.4 µm.

14. The manufacturing method according to claim 1, wherein the active layer has a thickness of 0.05 µm to 0.09 µm, the gate insulation layer has a thickness of 0.1 µm to 0.2 µm, and the gate electrode has a thickness of 0.4 µm to 0.6 µm.

15. The manufacturing method according to claim 1, wherein a material of the active layer comprises IGZO.

16. A display substrate manufactured by the manufacturing method of the display substrate according to claim 1.

17. A display device, comprising the display substrate according to claim 16.

18. A manufacturing method of a display substrate, comprising manufacturing a top-gate type thin film transistor on a side of a base substrate, wherein the manufacturing the top-gate type thin film transistor on the side of the base substrate comprises following steps of:
    forming an active layer, a gate insulation film layer, a gate film layer and a photoresist film layer sequentially on the base substrate;
    pre-baking the photoresist film layer;
    exposing the photoresist film layer to a light using a mask as a protection mask, and developing the exposed photoresist film layer without post-baking;
    over-etching the gate film layer to form a gate electrode using the developed photoresist film layer as a protection mask;
    over-etching the gate insulation film layer by a gaseous corrosion method to form a gate insulation layer using the developed photoresist film layer as a protection mask, wherein a gas atmosphere of the gaseous corrosion comprises carbon tetrafluoride ($CF_4$) at a flow rate of 2000 to 2500 SCCM and oxygen ($O_2$) at a flow rate of 200 to 650 SCCM;
    peeling off the photoresist film layer remained on a surface of the gate electrode; and
    performing a conductive treatment to the active layer using the gate insulation layer as a protection mask,
    wherein the gate film layer is made from an aluminum material, the gate film layer is etched by a wet etching method, and the etching solvent is mixed acid; and
    wherein the exposed photoresist film layer is developed until the developed photoresist film layer has a thickness of 1.8 µm to 2.2 µm and a slope angle not less than 70°.

19. A display substrate manufactured by the manufacturing method of the display substrate according to claim 18.

* * * * *